United States Patent [19]

Valente et al.

[11] Patent Number: 5,393,568
[45] Date of Patent: Feb. 28, 1995

[54] METALIZED COATING PROCESS

[75] Inventors: Thomas J. Valente, 226 Via Morella, Encinitas, Calif. 92024; Henri J. A. Charmasson, San Diego, Calif.

[73] Assignee: Thomas J. Valente

[21] Appl. No.: 160,428

[22] Filed: Nov. 30, 1993

Related U.S. Application Data

[63] Continuation of Ser. No. 60,162, May 7, 1993, abandoned, which is a continuation-in-part of Ser. No. 843,951, Feb. 28, 1992, abandoned.

[51] Int. Cl.⁶ .............................. B05D 3/10
[52] U.S. Cl. .................. 427/385.5; 427/123; 427/367; 427/375; 427/376.3; 427/386; 427/407.1
[58] Field of Search .............. 427/367, 337, 385.5, 427/386, 407.1, 424, 123, 375, 376.3

[56] References Cited

U.S. PATENT DOCUMENTS

| | | | |
|---|---|---|---|
| 3,801,364 | 4/1974 | Kojima et al. | 427/98 |
| 3,904,791 | 9/1975 | Iverson et al. | 427/277 |
| 3,919,441 | 11/1975 | Horiki | 427/113 |
| 3,923,721 | 12/1975 | Edwards et al. | 260/840 |
| 3,932,344 | 1/1976 | O'Day, Jr. et al. | 260/848 |
| 4,220,675 | 9/1980 | Imazaki | 427/27 |
| 4,288,353 | 9/1981 | Eckel et al. | 156/337 |
| 4,540,463 | 9/1985 | Kakuhashi et al. | 427/103 |
| 4,543,403 | 9/1985 | Isayama et al. | 526/263 |
| 4,593,068 | 6/1986 | Hirose et al. | 525/100 |
| 4,678,717 | 7/1987 | Nickola et al. | 428/553 |
| 5,064,695 | 11/1991 | Hotta et al. | 427/407.1 |
| 5,098,938 | 3/1992 | Savin | 524/492 |
| 5,216,093 | 6/1993 | Hayashi et al. | 525/524 |

*Primary Examiner*—Anthony McFarlane
*Attorney, Agent, or Firm*—Henri J. A. Charmasson; John D. Buchaca

[57] ABSTRACT

A cold process for laying a textured or polished coat of bronze, copper, brass, pewter or other metallic substance over a mineral or organic surface comprises the step of mixing a sintering metal powder with a polyester resin and a ketonic catalyst for forming a spreadable, moldable or sprayable paste that hardens to a coat having essentially the mechanical and chemical characteristics of the selected metallic substance, but exhibiting no electrical conductivity.

16 Claims, 2 Drawing Sheets

METALIZED COATING PROCESS

PRIOR APPLICATION

This is a continuation of application Ser. No. 08/060,162, filed May 7, 1993, now abandoned, which is a continuation-in-part application of application Ser. No. 07/843,951, filed Feb. 28, 1992, now abandoned.

FIELD OF THE INVENTION

This invention relates to metal coating processes, and more specifically to the metalization of natural and synthetic surfaces for practical and aesthetic purposes.

BACKGROUND OF THE INVENTION

Metals and alloys such as copper, zinc, brass, bronze, and pewter are appreciated for their mechanical and aesthetic qualities and are used extensively in structural or decorative applications in buildings as well as art objects. However, because of the cost, limited malleability and weight of metallic substances, they are often replaced nowadays by plastics and other synthetic substances. Indeed, plastics are usually less expensive than metal, much lighter, and can be easily molded. This substitution of plastic for metals is particularly evident in the automobile manufacturing and building industries. Plastics, however, do not have the advantageous characteristics of metals such as resistance to fire and aesthetic appeal.

Art objects such as sculptures made of brass, bronze or pewter are more prized than similar articles made of plaster or clay. However, brass, bronze or pewter sculptures must be first created in a malleable material such as clay. The clay original is then used to make a mold for casting metallic copies of the original work of art. It would be advantageous to have a malleable medium that can be hardened to the consistency and mechanical as well as aesthetic qualities of metals and alloys. Such a medium could be used for coating structures made of malleable material such as clays and plastics or to make an article that can be easily sculptured or texturized before hardening to a metal-like consistency.

For centuries mariners have tried to prevent marine life from attaching to boat and ship hulls and thereby reducing hull efficiency and durability. This attachment of marine plants and animals is called "fouling". The most effective anti-fouling coatings depend, to a certain extent, on copper-based paints, and on certain poisonous substances that can affect the environment.

The protection of metallic structures in an underwater environment presents another problem. Ship hulls made of steel are subject to electrochemical corrosion in addition to biological fouling. When copper or other noble metals are placed in electrical contact with steel in the presence of water, the galvanic potential difference between the two metals causes the steel to be preferentially attacked by electrochemical corrosion because the Copper is more cathodic than steel. The prior art solution usually involved a complex layered approach which electricallyinsulates the copper from the steel as disclosed in U.S. Pat. No. 4,678,692 Porter.

The manufacturing of electrical and electronic devices ranging from giant power machinery to minuscule microcircuit chips requires the use of electrically non-conductive materials to form enclosures, armature supports, connectors, substrates, potting compounds and other parts and components. The most commonly used insulating material such as plastic, silica and resins are poor conductors and dissipators of heat, and tend instead to concentrate the heat generated by electrical currents circulating through the device's circuitry into the device itself. Moreover, these materials cannot be securely bonded to conductive elements of electrical circuits that are usually made of, copper, aluminum, silver, gold or other alloys thereof. These conductive metals and alloys have relatively high coefficients of thermal expansion compared to the above-cited insulating materials. Thus, while the non-conductive materials contribute to the concentration of heat around current-conducting metallic components, they do not expand or contract at the same rate and to the same extent as those components. It would be advantageous to have non-electrically conductive materials that exhibit coefficients of thermal conductivity approaching those of copper, silver, aluminum and other metals commonly used in the fabrication of current-carrying components, and coefficients of thermal expansion that are commensurate with those of the material used to form the active segments of electrical and electronic circuits.

SUMMARY OF THE INVENTION

The principal and secondary objects of this invention are to provide a simple process for creating a malleable metallic substance with sufficient viscosity to be spread or textured, and which can easily be applied over any mineral or organic as well as natural or synthetic surface before hardening to a machinable form having all the surface properties of a desired metal, including a high coefficient of thermal conductivity but no electrical conductivity.

These and other objects are achieved by a mixture of polyester gel with an atomized metal powder and a ketonic catalyst.

DESCRIPTION OF THE PREFERRED EMBODIMENT OF THE INVENTION

Figure 1:
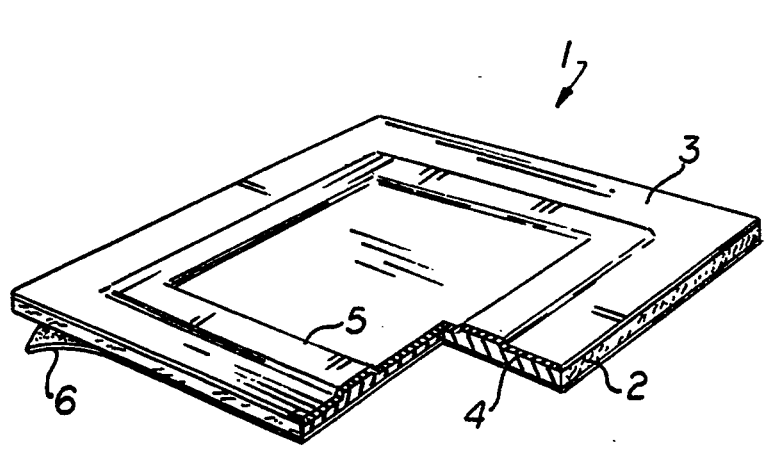
FIG. 1 is a perspective view of a floor tile metal-coated according to the invention.

A malleable metallic paste is prepared by selecting a thermosetting synthetic resin such as an epoxy resin or a polyester resin. The latter can be in the form of a polyester resin gel commonly available from Lilly and other suppliers for the casting of artificial marble slabs. This type of resin allows the paste to be formed, mixed, applied to the desired surface, cured and finished while at room temperature.

The resin is mixed with up to 91% per weight of an atomized metal power of the type used in powder metallurgy to form sintered compacts as disclosed in U.S. Pat. No. 4,159,378 Bankowski et al., or as infiltrant for iron powder compacts as disclosed in U.S. Pat. No. 3,429,696 Werley et al. This type of metal powder is commonly available from Zinc Corporation of America, of Monaca, Pa., U.S. Bronze Powers, Inc. of Flemington., N.J., and other manufacturers. These metal powders are, characterized by their extremely fine mesh, down to 30 microns, obtained by an atomizing process such as the one disclosed in U.S. Pat. No. 3,128,172 Wagner et al., or by even finer mesh, down to 2 microns, obtained by chemical reduction. Each metal particle has a large surface area for contacting the resin, adding durability and strength. Sintering metal powder of oxidized granules are preferred for certain applications. Oxidation of the metal granules is often a direct result of the atomizing process of sintering powder fabrication.

The appropriate catalyst is then admixed with the polyester resin gel. A 2% by weight of the gel of methyl ethyl keton peroxide is preferably used. The resulting paste can then be molded, rolled, spread or sprayed on any surface including wood, paper, fabric, synthetic plastic, stone, ceramic and metal to any thickness down to 125 microns (5 mils) without diluting the paste to a liquid state. Ceramic and metal surfaces should preferably be unfinished and have a minimum tooth of approximately 2 microns (80 microinches). The curing time at ambient temperatures of 25 degrees centigrade is approximately 24 hours. This curing time may be accelerated by subjecting the coating to higher ambient temperatures of up to 150° C. The paste may be sprayed without causing atomization through the nozzle of the spray gun such as an AccuSpray HVLP spray gun equipped with a 2.75 millimeters (110 mils) nozzle Once cured, the resulting coating is extremely strong and durable due to the chemical bond formed over the entire surface area of each particle. The metalized substance can then be finished by texturing, sculpting, machining, sanding, polishing, chemically treating, etching, plating or anodizing for mechanical or aesthetic purposes. The surface may be subjected briefly to flame temperatures of up to 2,400 degrees F in order to create surface color variations. To increase the overall thickness of the coating, additional layers may be successively applied without treating the previous layer or applying the successive layer within the specific timeframe. The finish coating can withstand continuous temperatures up to 175° F. and temporary exposure up to 350° F. without affecting the bond between the metal particles and the resin.

The optimum type of resin used is determined by the specific application. For example, an isophthalic resin may be used if an especially hard and durable coating is required.

Similarly, the optimum size and shape of metal particles within the powder depends on the application. For an aesthetically appealing material, a popcorn-shaped type particle of between 40 and 150 microns is acceptable. In certain applications requiring an homogeneous mixture of different metals, spherical particles of between 2 and 10 microns are preferred.

Certain surfacing agents may be added during the mixing stage which generate an additional layer of different material as the mixture hardens. For example, wax may be added to the mixture prior to application. As the mixture hardens, a wax shield will form on the surface of the coating, providing additional protection.

It should be noted that although the metalized substance retains some of the mechanical, chemical and thermal characteristics of their metal components, they are not electrically conductive. A substance loaded with 91% per weight of oxidized copper powder No. C-118 from U.S. Bronze Powders, Inc. using a isophthalic acid-based polyester resin yielded an electrically non-conductive coating with a specific gravity of 5.9, i.e., approximately to 65% of the specific gravity of copper.

The following are specific examples of utilizing the coating process to improve products in a wide variety of fields. These are by no means the only applications of the process available.

FIG. 1 illustrates a metalized floor tile 1 made from an ordinary vinyl tile 2 with its top surface 3 covered, according to the invention, with a 2 millimeter layer 4 of brass or other metal or alloy compound. The metalized layer 4 is thick enough to provide long life under traffic wear and periodical polishing, but thin enough to let the ornamental design 5 embossed in the original vinyl surface to show through the metalized layer on the top surface of the article. The tile may be installed on a smooth surface after peeling off the film 6 protecting the adhesive undercoating of the original article.

The metalized substance can also be sprayed or spread directly over any floor or wall covering including linoleum, concrete slabs, ceramic tiles, plaster, moldings, wood panels and wall papers, in order to create an aesthetically appealing and impact and wear resistant coating.

Figure 2:
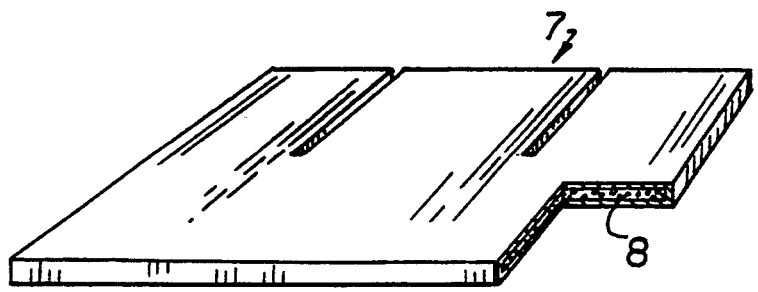
FIG. 2 is a perspective view of a copper roof shingle manufactured according to the invention.

FIG. 2 illustrates a roof shingle 7 made from a slab 8 of polyurethane sprayed on all sides with a 2 millimeter layer of a substance containing from 40% to 60% of oxidized copper according to the invention. It should be noted that the electrical non-conductivity of the shingle allows the construction of copper roofs that are less susceptible to damage by lightning than conductive copper roofs.

Figure 3:
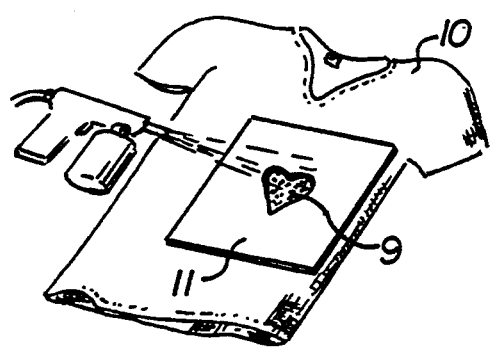
FIG. 3 illustrates a decorative metal spraying process according to the invention.

Thin layers of metalized compound, typically 1 millimeter thick, may be applied to fabrics and articles of clothing to create decorative designs. FIG. 3 illustrates the spraying of a design 9 on a shirt 10 through a stencil mask 11.

Metalized substances including up to 91% per weight of a sintering powder taken from a group consisting of sintering powders of copper, copper alloys, gold and silver have been shown to be non-electrically conductive, but to exhibit a coefficient of thermal conductivity only 50% less then the coefficient of thermal conductivity of the corresponding pure metal or alloy. For instance, a metalized substance according to the invention including 90% per weight of oxidized copper powder was shown to have a coefficient of thermal conductivity equivalent to that of most steels.

The electrical non-conductivity of the final product is believed to result from the resin film, and, in the case of oxidized particles, from the oxide layer surrounding each metal particle.

Figure 4:
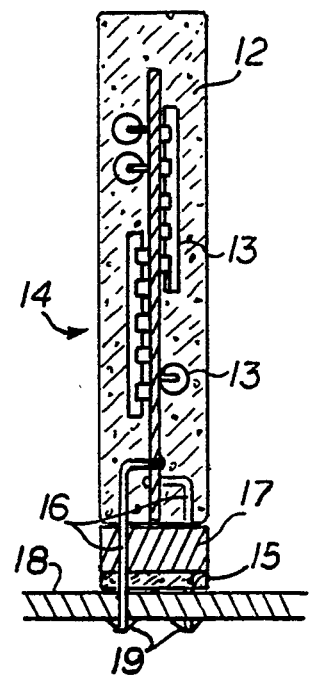
FIG. 4 is a cross-sectional view of an electronic circuit assembly fusing heat-dissipating structures according to the invention.

FIG. 4 illustrates the use of a metalized compound made from oxidized copper powder as a packaging stabilizer and heat dissipating potting material 12 applied over the circuit components 13 of an electronic plug-in device 14. The same substance is also applied as a heatsink layer 15 at the sole and around the pins 16 of an edge connector 17 soldered to a motherboard 18.

Such a heatsink will dissipate the heat generated by the soldering 19 of the pins 16, thus preventing such heat from being transmitted to the electronic components. It should be noted that the entire body of the edge connector 17 can also be made according to the invention of a metalized, yet non-conductive material.

Figure 5:
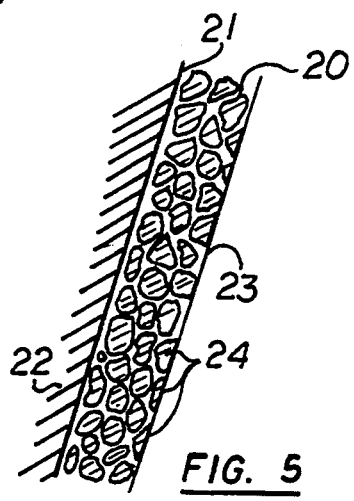
FIG. 5 is a protective copper coating according to the invention.

FIG. 5 illustrates the application of an anti-fouling copper composition 20 to the submerged surface 21 of a marine structure 22 such as the steel hull of a ship.

A metalized composition according to the invention containing 30% to 90% per weight of oxidized sintering copper powder combined with an isophthalic acid-based polyester resin is sprayed directly to the submergeable surface 21. The outer surface 23 is then polished to expose part of the surface copper particles 24.

The current flow and reaction of seawater with the exposed copper particles result in a slow, steady and environmentally safe release of biocidal and anti-fouling copper, and cuprous oxides and salts. Since the copper particles are not in direct contact with the steel surface 21 and the coating is nonconductive, the risk of electrolytic corrosion of the steel surface resulting from galvanic current is reduced, if not completely eliminated.

The electrically non-conductive properties of metalizing substances taught by the invention allow their use as core materials in the manufacture of electrical instruments including heating devices. A resistance or other heating element can be embedded in a layer of copper or brass-based substance formed as a heating plate or cooking stencil.

Figure 6:
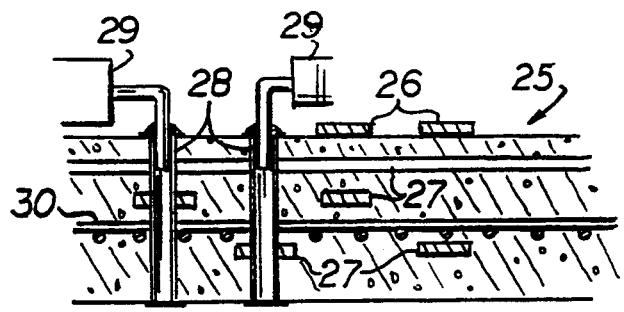
FIG. 6 is a cross-sectional view of an electronic circuit substrate manufactured according to the invention.

FIG. 6 illustrates an application of the invention to the construction of an electrical or electronic circuit substrate.

The substrate 25 may be a printed circuit board or a microcircuit assembly having surface carrying leads 26 as well as buried ones 27. Some of the latter are accessible via feedthrough 28 for connection to surface components 29.

The substrate is laminated around a synthetic mesh 30 for structural strength and stability. This substrate is better able to spread and dissipate heat generated by the circuitry than conventional printed circuit boards and substrates made of epoxy and other synthetic non-conductive materials. Similar laminated or pressed structures can be made in layers containing reinforcing fibers that are oriented in various directions from one layer to the next in order to form extremely strong articles.

Because of its viscous consistency and slow curing property at room temperature, a metal-carrying substance prepared according to the invention can be used in the same manner or in lieu of fiberglass to form various types of structures.

Figure 7:
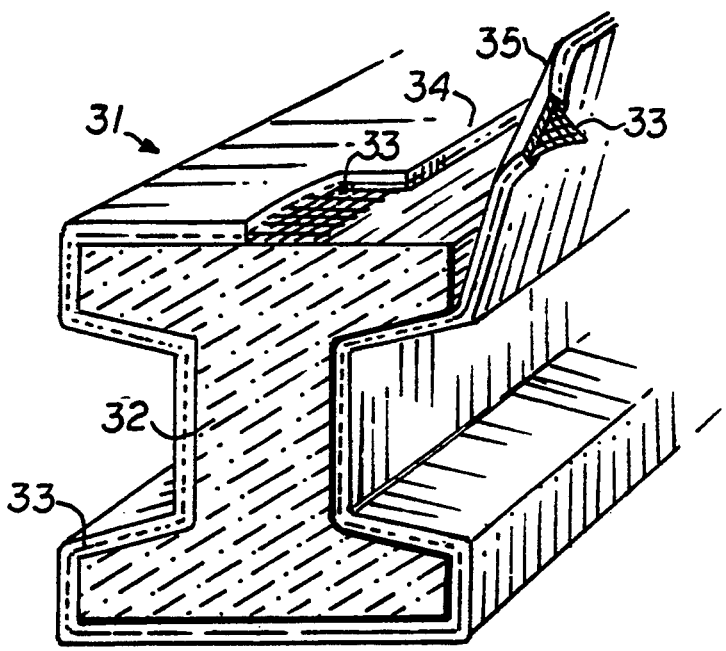
FIG. 7 is a perspective view of structural beam manufactured according to the invention.

FIG. 7 illustrates the fabrication of a I-beam structure 31 whose core 32 is made from a slab of polyurethane foam or other synthetic material. A sheet of pliable mesh 33 coated on both sides with the metalized substance is wrapped around the core 32. The edges 34, 35 of the sheet are overlapped and pressed together to blend to a smooth surface. After curing, the structure offers and advantageous compromise between the strength and weight of a steel beam of the same dimension and shape. The structural strength of such a beam can be increased by addition of carbon or glass fiber to the metalized substance as described earlier.

Figure 8:
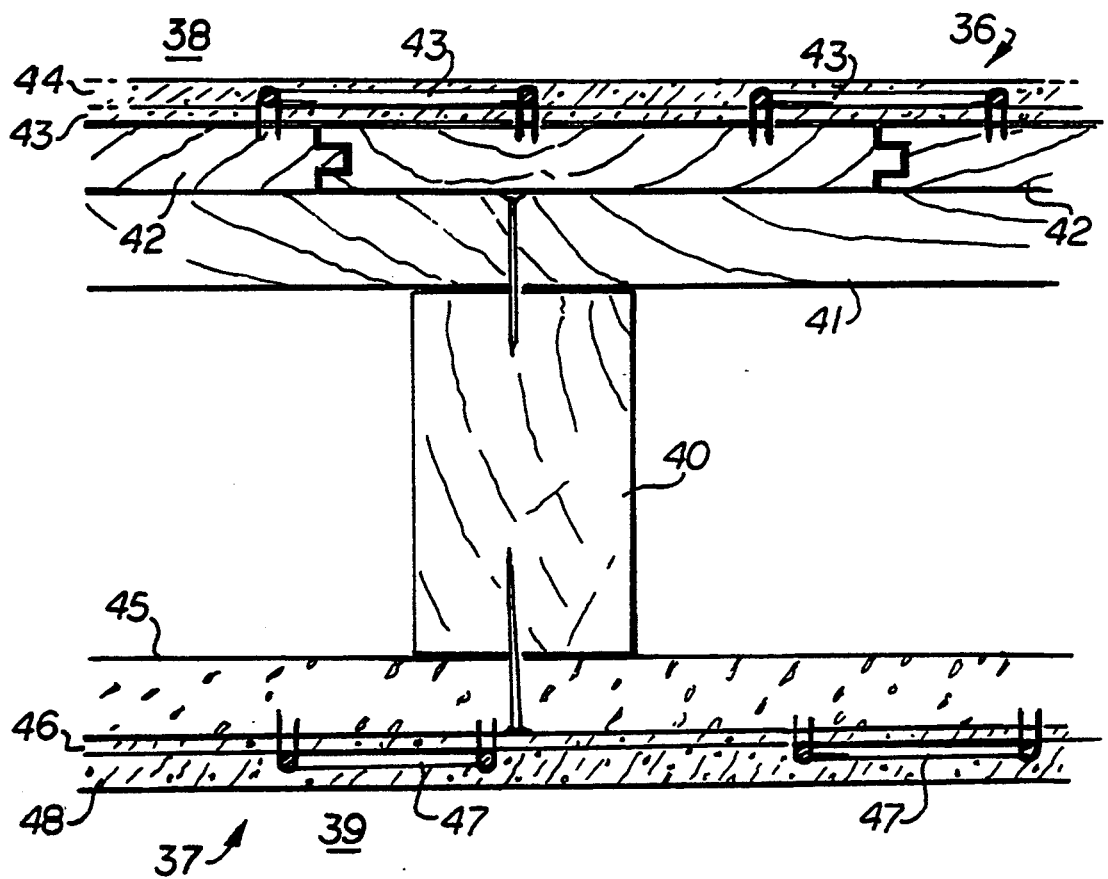
FIG. 8 is a cross-sectional view of a floor incorporating a heating system installed according to the invention.

FIG. 8 illustrates the use of a metalized coating to form a heating floor 36 and heating ceiling 37. A floor between two residential units 38, 39 comprises a series of joists 40 supporting-floor cross-joists 41 and floor boards 42. A first layer 43 of coating is applied to the top surface of the floor board 42. A heating element 43 is stapled over the first coat. The heating element may be an electrical resistance, or a heating fluid conduit. A second, top coat 44 is then applied over the first covering the heating element.

The ceiling of the lower residential unit 30 comprises plaster boards 45 nailed to the joists 40. A first layer 46 of metalized coating is applied to the exposed side of the plaster board. The heating element 47 is then stapled against the first layer 46 before applying a second layer 48 of metalized coating.

The top and final layers 44, 48 may be textured before curing, or sanded, machined, and/or polished to simulate tiles or other decorative motifs.

While copper-based substances are favored for such an application because of the superior heat transfer characteristic of that metal, bronze, brass, pewter, stainless steel and many other metal and alloy powders may be used separately or in combination in the fabrication of the coating to achieve a variety of decorative effect.

Other applications include protective undercoating for automobiles and other vehicles, aesthetically pleasing coatings for appliances and furniture, even the kitchen sink and mirrors. The process and can even be used to create more stable and durable dental fillings.

Some functional uses include applying an economical coating of very hard and expensive metal such as high carbon steel to machine tools made of a cheaper and perhaps more heat transmitting inner metal. The coat can be applied to one surface of the tool at a time to maintain sharpness.

A paste of lead or other radiation resistant metal can be used to coat nuclear waste containers. Since the particles of metal are so closely packed, the coating can prevent the passage of radiation through the coat while using less metal and providing more ruggedness than using the metal alone. As described earlier, wax can be added to the paste and allowed to surface during curing providing added neutron radiation protection.

Containers made of wood, cardboard, polyurethane foam or other soft material can be stiffened, strengthened, sealed and waterproofed by spraying a metalized coating prior to shipment.

As an alternate application to the coating of a surface, the paste itself. Can be molded or sculptured into homogeneous objects at room temperature. This allows the cold casting of objects consisting exclusively of hardened paste. As with the coating process, the user may undertake the additional step of using high heat to flash off surface resin from cured objects and fuse the surface metal thereby making the surface indistinguishable from pure metal castings.

Finally, the electrically non-conductive substances according to the invention can be molded and cured to form cookware suitable for use in microwave ovens.

While the preferred embodiments of the invention have been described, modifications can be made and other embodiments may be devised without departing from the spirit of the invention and the scope of the appended claims.

What is claimed is:

1. A process for coating a surface with a metal-and-resin composition, said process comprising:
   forming at room temperature, a mixture of spreadable paste of up to 91% per weight of an atomized sintering metal powder having particle sizes from 2 to 150 microns with a thermosetting synthetic resin which cures to hardness when heated;

admixing a catalyst;

applying said mixture in an unliquified, malleable state over polished and non-polished areas of said surface;

curing said mixture to hardness at ambient temperature up to 150° C.; and finishing said applied and hardened mixture.

2. The process of claim 1, wherein said resin is selected from a group consisting of epoxy resins and polyester resins.

3. The process of claim 2, wherein said polyester resin is an artificial marble polyester gel; and said catalyst is a two percent of said gel volume of a ketonic catalyst.

4. The process of claim 3, wherein said ketonic catalyst is a methyl ethyl keton peroxide.

5. The process of claim 4, wherein said step of forming said mixture comprises mixing 40% to 60% per volume of said metal powder with said resin.

6. The process of claim 5, wherein said step of finishing comprises chemically etching said hardened mixture.

7. The process of claim 5, wherein said step of finishing comprises exposing said hardened surface to flame temperatures up to 2,300 degrees F.

8. The process of claim 4, wherein said step of finishing comprises mechanically texturing said hardened surface.

9. A process for coating a surface with a metal-and-resin composition said process comprising:

forming at room temperature, a spreadable paste with a first volume of sintering metal power and a second volume of thermosetting isophthalic, acid-based polyester resin;

admixing a catalyst;

applying said paste in an unliquified, malleable state over said surface; and curing said paste to hardness at a temperature of up to 150° C.

10. The process of claim 9, wherein said metal powder comprises a plurality of metal particles having an average greatest dimension of between 2 and 150 microns.

11. The process of claim 9, wherein said applying comprises applying at least two layers of said paste over said surface; and embedding a reinforcing mesh between two of said layers.

12. The process of claim 11, wherein said mixture contains up to 95% metal powder by weight.

13. The process of claim 9, wherein said step of applying said paste comprises:

spraying said paste onto said surface, said spraying comprising particularizing said paste into particles having a largest dimension of no more than 2.75 millimeters.

14. A process for coating a surface with an electrically non-conductive metallic substance which comprises:

forming, at room temperature, a viscous mixture of up to 91% per volume of a sintering metal powder and an isophthalic acid-based polyester resin wherein said sintering metal powder is selected from a group consisting of oxidized copper granules, oxidized copper alloy granules, gold granules and oxidized silver granules;

admixing a catalyst;

applying said mixture to said surface; and curing said mixture at ambient temperature of up to 150° C.

15. The process of claim 14, wherein said applying comprises spraying said mixture to a submergeable structure to prevent fouling of said structure by marine organisms; and wherein said forming comprises selecting a sintering powder of oxidized copper granules.

16. The process of claim 14, wherein said step of applying comprises shaping said mixture into a heat-dissipating layer in contact with said surface.

* * * * *